(12) United States Patent
Tseng

(10) Patent No.: US 6,503,764 B1
(45) Date of Patent: Jan. 7, 2003

(54) METHOD OF MAKING IN HIGH DENSITY DRAM CIRCUIT HAVING A STACKED CAPACITOR

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/012,472

(22) Filed: Dec. 12, 2001

(51) Int. Cl.[7] .......................................... H01L 21/8242
(52) U.S. Cl. .............................. 438/3; 438/253; 438/240
(58) Field of Search ............................ 438/3, 240, 238, 438/253–256, 381, 396–399

(56) References Cited

U.S. PATENT DOCUMENTS 6,288,446 B2 * 9/2001 Kwak et al. ................ 257/295
6,376,325 B1 * 4/2002 Koo ........................... 438/250

* cited by examiner

Primary Examiner—Jey Tsai
(74) Attorney, Agent, or Firm—Troxell Law Office PLLC

(57) ABSTRACT

The present invention discloses a method of making stacked Metal-Insulator-Metal capacitor in high density DRAM circuit, comprising the steps of: forming a contact plug in an insulating layer on a semiconductor substrate; forming a first conductor layer, a first barrier metal layer, a first transition metal layer, and a sacrificial layer in sequence; patterning said first conductor layer, said first barrier metal layer, said first transition metal layer, and said sacrificial layer stopping on said insulating layer; forming a second barrier metal layer and then etch back to form a barrier metal spacer; removing said sacrificial layer to form a recess between said barrier metal spacer; forming a second transition metal layer and then etch back to form a transition metal spacer; forming a high dielectric constant layer.

18 Claims, 7 Drawing Sheets

METHOD OF MAKING IN HIGH DENSITY DRAM CIRCUIT HAVING A STACKED CAPACITOR

BACKGROUND OF THE INVENTION

1. Field of the Invention

The present invention generally relates to a stacked capacitor and method of making in high density DRAM circuit, and more particularly, to a method for making a high capacitance stacked capacitor in high density DRAM circuit.

2. Description of the Prior Art

A memory has two operations: electrical program and electrical erasure. In generally, the basic configuration of memory is composed of two major portions: the memory cell array and the peripheral circuit. The memory cell array for data storage is constructed by a plurality of memory cells regularly arranged in an array based on the intersected word lines and bit lines. The peripheral circuit provides the flash memory with functions such as power supply and data processing during operation. So how to improve the capacitance of DRAM (Dynamic Random Access Memory) becomes the most important objective of DRAM industry.

In the prior art, all uses polysilicon to form electrode of a stacked capacitor, and with the result that it can only use low dielectric constant materials for dielectric layer, such as NO, ONO, or the like. Then to use metal-insulator-metal (MIM) to improve the capacitance of stacked capacitor, for example, the U.S. Pat. No. 6,277,702 discloses a method of fabricating capacitor of a semiconductor device. Please refer to FIG. 1A to FIG. 1C, in which the method for fabrication is schematically illustrated. As shown in FIG. 1A, to begin with, there is provided a semiconductor substrate 1, on which a field oxide layer 2 is formed to define an active area and then an insulator layer 3 is deposited on it. By using a standard photolithography process to form a contact plug in the insulator layer 3. Depositing a conductor layer 5, a first barrier metal layer 6, and a first transition metal layer 7 in sequence and then using a standard photolithography process to form in which FIG. 1 shows. The conductor layer 5 is formed of polysilicon to a thickness of about 1000 to 6000 Å. As shown in FIG. 1B, a second barrier metal layer is deposited on the insulator layer 3, the conductor layer 5, the first barrier metal layer 6, and the second transition metal layer 7. An etching back process is performed to form barrier metal spacer 8. The second barrier metal layer is made of the same material as the first barrier layer 6. A second transition metal is deposited on the resulting structure. The second transition metal is then etched back to form transition metal spacer 9. As shown in FIG. 1C, finally, depositing a high dielectric constant layer 10 on the resulting structure.

This invention further discloses a Metal-Insulator-Metal capacitor having higher capacitance and method of making.

SUMMARY OF THE INVENTION

It is the primary object of the present invention to provide a metal-insulator-metal (I) structure and fabrication so that to fabricate the high density DRAM.

In order to achieve the foregoing object, the present invention provides a method of making stacked capacitor in high density DRAM circuit, comprising the steps of:

forming a contact plug in an insulating layer on a semiconductor substrate;

forming a first conductor layer, a first barrier metal layer, a first transition metal layer, and a sacrificial layer in sequence;

patterning said first conductor layer, said first barrier metal layer, said first transition metal layer, and said sacrificial layer stopping on said insulating layer;

forming a second barrier metal layer and then etch back to form a barrier metal spacer;

removing said sacrificial layer to form a recess between said barrier metal spacer;

forming a second transition metal layer and then etch back to form a transition metal spacer; and forming a high dielectric constant layer.

The present invention provides a method of making stacked capacitor in high density DRAM circuit, further comprising the step of:

depositing a silicon nitride layer as a chemical mechanical polishing (CMP) stopper.

BRIEF DESCRIPTION OF THE DRAWINGS

The objects, spirits and advantages of the preferred embodiment of the present invention will be readily understood with reference to the accompanying drawings and detailed descriptions, wherein.

DETAILED DESCRIPTION OF THE INVENTION

Figure 1A:
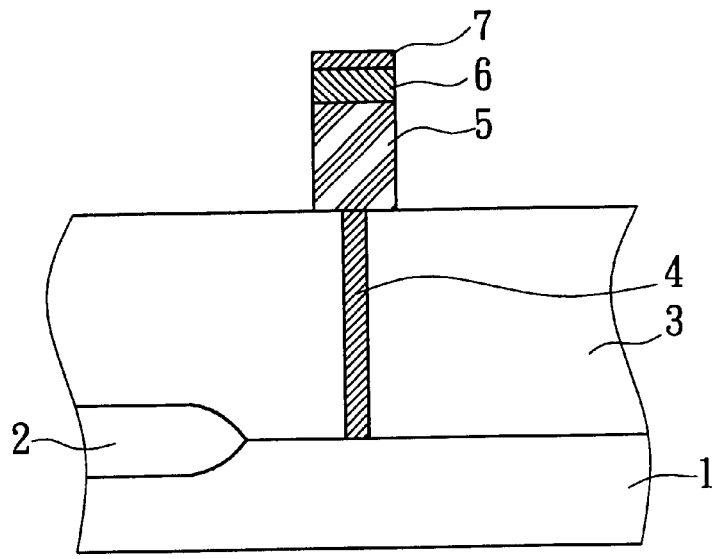
FIG. 1A to FIG. 1C schematically illustrates the method for fabricating the stacked capacitor of a semiconductor device in accordance with the prior art.
Figure 1B:
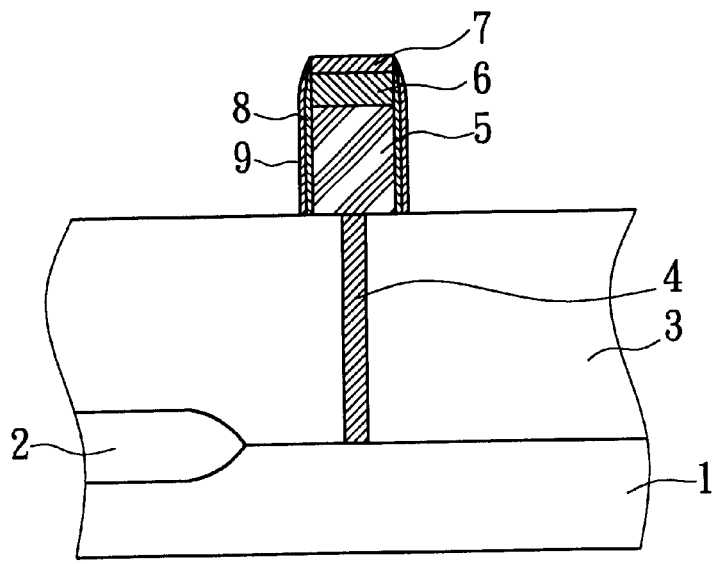
Figure 1C:
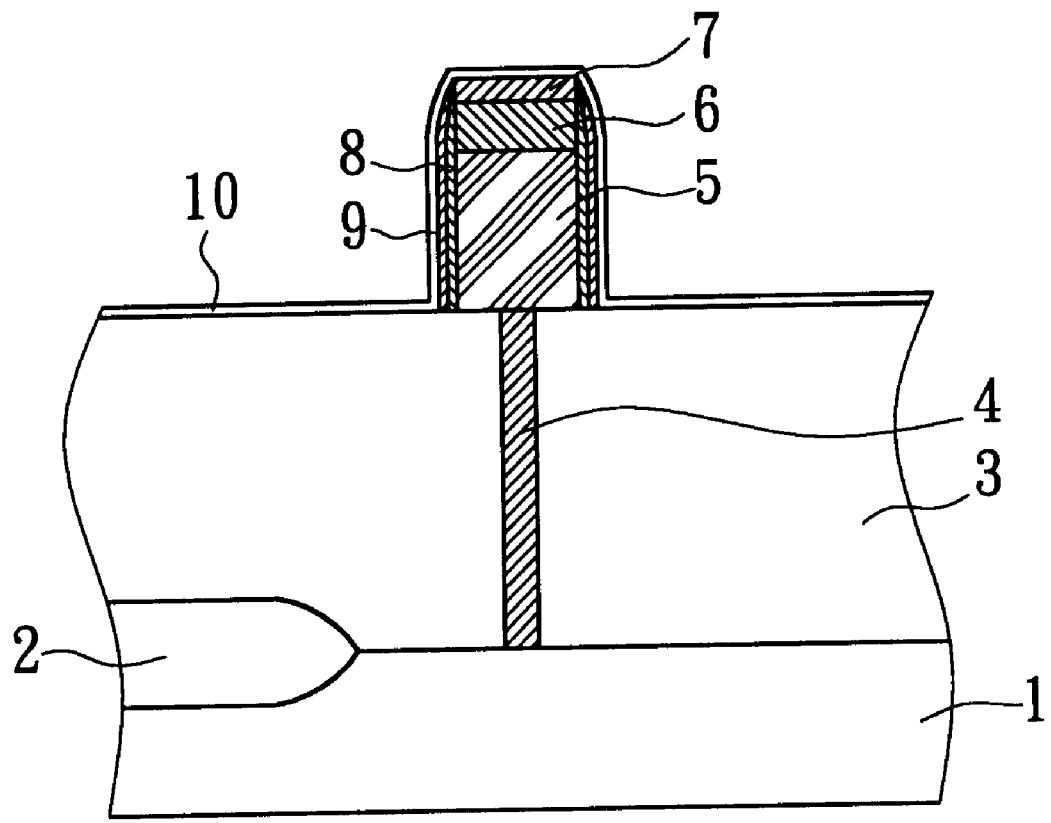
Figure 2A:
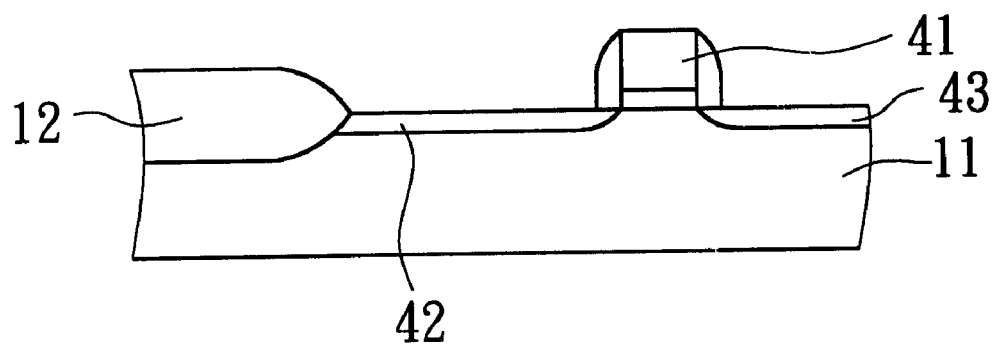
FIG. 2A to FIG. 2I schematically illustrates a stacked capacitor and method of making in high density DRAM circuit in accordance with the embodiment of the present invention.

The present invention provides a method of making stacked capacitor in high density DRAM circuit, comprising the steps of:

(a) As shown in FIG. 2A, there is provided a semiconductor substrate 11, on which a field oxide layer 12, a transistor 41, a source 42 and drain 43 are formed.

Figure 2B:
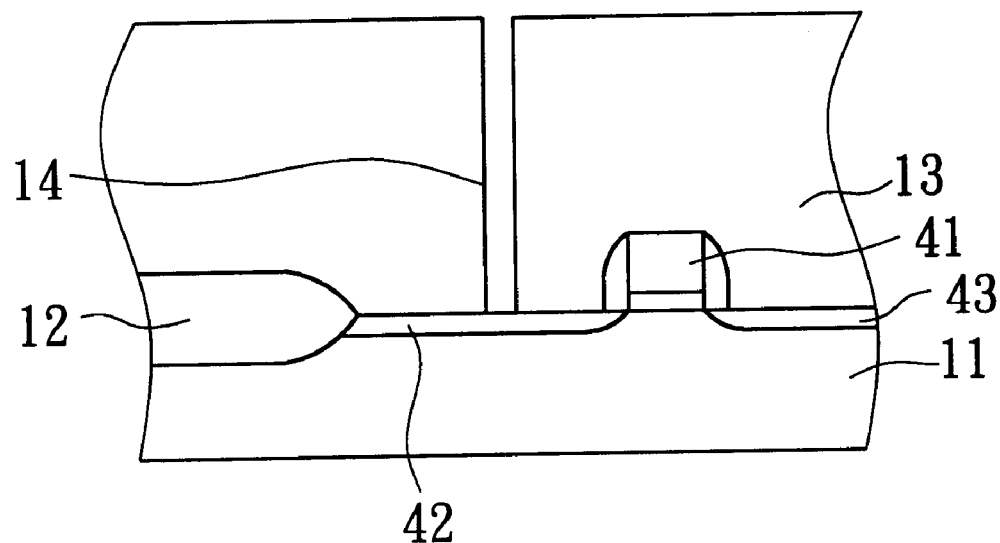

(b) As shown in FIG. 2B, depositing at least a first dielectric layer 13 to be an insulating layer. By using the patterned photoresist layer, the first dielectric layer 13 is etched to form a contact hole 14 having a width of about 0.05 to 0.3 $\mu$m, which reaches one of source 42 or drain 43.

Figure 2C:
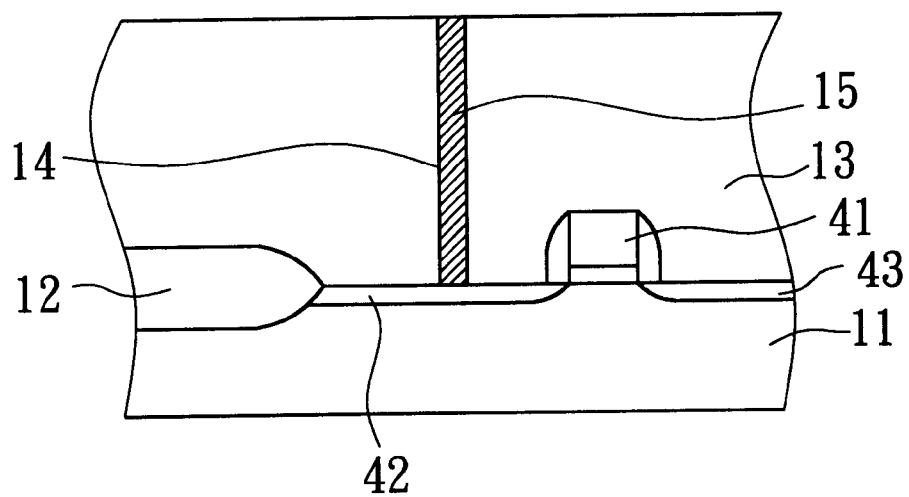

(c) As shown in FIG. 2C, a conductive layer is deposited in the contact hole 14 and on the first dielectric layer 13 and then planarized down to the upper surface of the first dielectric layer 13 to form a contact plug 15. The contact plug 15 is made of a material selected from the group consisting of polysilicon, tungsten, aluminum, amorphous silicon and the like. There is a step, further comprising, after the step of depositing first dielectric layer 13 to deposit a silicon nitride layer as a chemical mechanical polishing (CMP) stopper, wherein said first dielectric layer is made of a material selected from the group consisting of BPSG (BoroPhosphoSilicate Glass), USG (Undoped Silicate Glass) and the like.

Figure 2D:
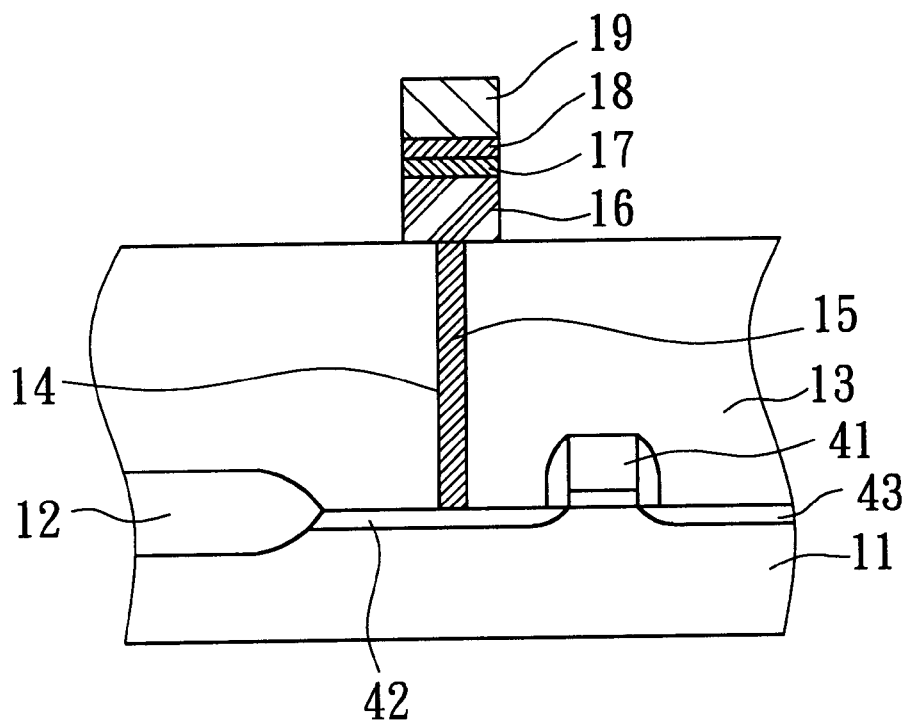

(d) As shown in FIG. 2D, forming a first conductor layer 16, a first barrier metal layer 17, a first transition metal layer 18, and a sacrificial layer 19 in sequence on the first dielectric layer 13 and the contact plug 15. By using a standard photolithography process to Pattern the first conductor layer 16, the first barrier metal layer 17, the first transition metal layer 18, and the sacrificial layer 19 to stop on the first dielectric layer 13. The first conductor layer 16 is formed by depositing a material of polysilicon and the like to a thickness of about 500 to 3000 Å. The first barrier metal layer 17 is formed of a material selected from the group consisting of TiAlN, TiSiN, TaTiN, TaAlN, and the like to a thickness of about 50 to 300 Å. The first transition metal layer 18 is formed of a material selected from the group consisting of platinum (Pt), iridium (Ir), ruthenium (Ru), and the like to a thickness of about 100 to 1000 Å. The sacrificial layer 19 is formed of a material selected from the group consisting of silicon nitride, $SiO_2$, SOG (Spin-On Glass), and the like to a thickness of about 300 to 2000 Å.

Figure 2E:
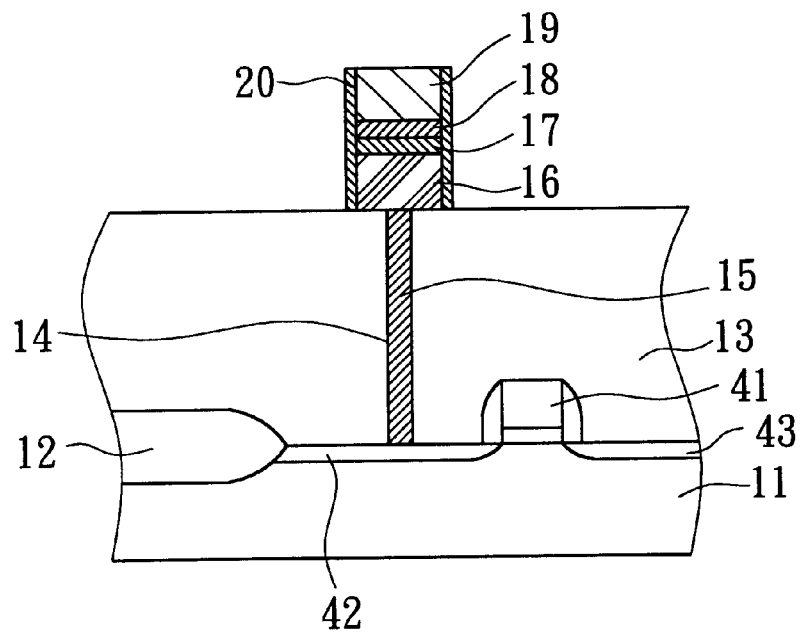

(e) As shown in FIG. 2E, then a second barrier metal layer is formed and an etching back process is performed to form a barrier metal spacer 20. The barrier metal spacer 20 is formed of a material selected from the group consisting of TiAlN, TiSiN, TaTiN, TaAlN, and the like to a thickness of about 50 to 1500 Å.

Figure 2F:
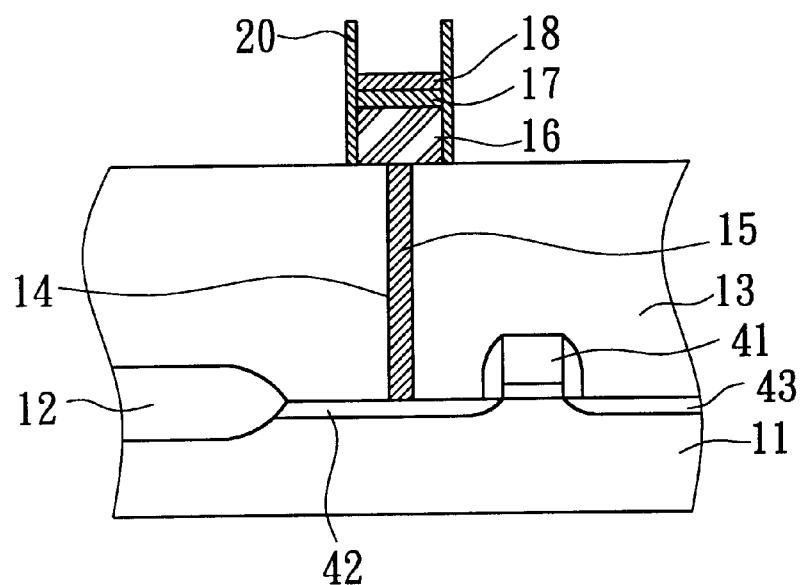

(f) As shown in FIG. 2F, removing the sacrificial layer 19 to form a recess between the barrier metal spacer 20. The feature of present invention is in this step, it can increase the surface area of the lower electrode of a stacked capacitor, i.e. can increase the capacitance of a stacked capacitor.

Figure 2G:
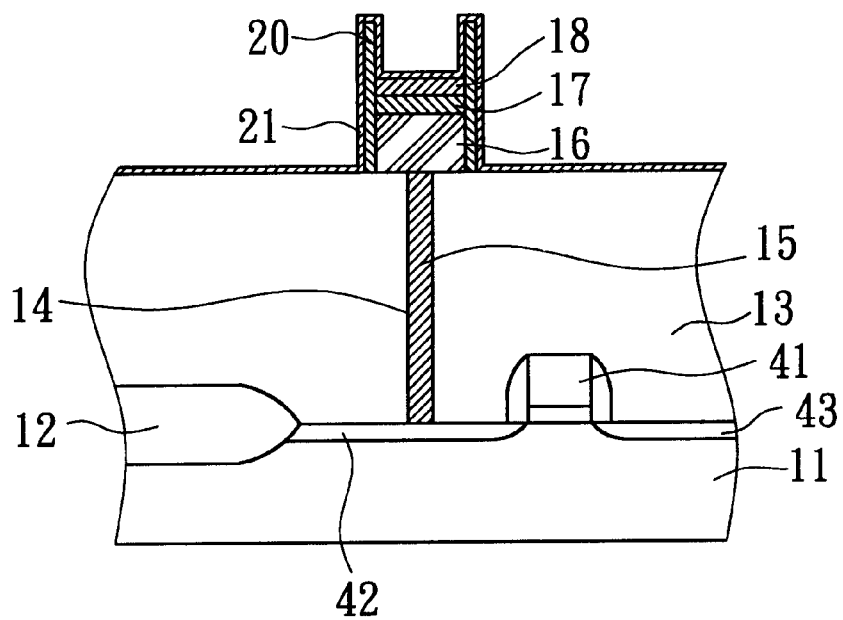

(g) As shown in FIG. 2G, depositing a second transition metal layer 21 to form like a conformal layer, i.e. covers the first dielectric layer 13 and all the way around the outside of the barrier metal spacer 20 and the top of the first transition metal layer 18. The second transition metal layer 21 is formed of a material selected from the group consisting of platinum (Pt), iridium (Ir), ruthenium (Ru), and the like.

Figure 2H:
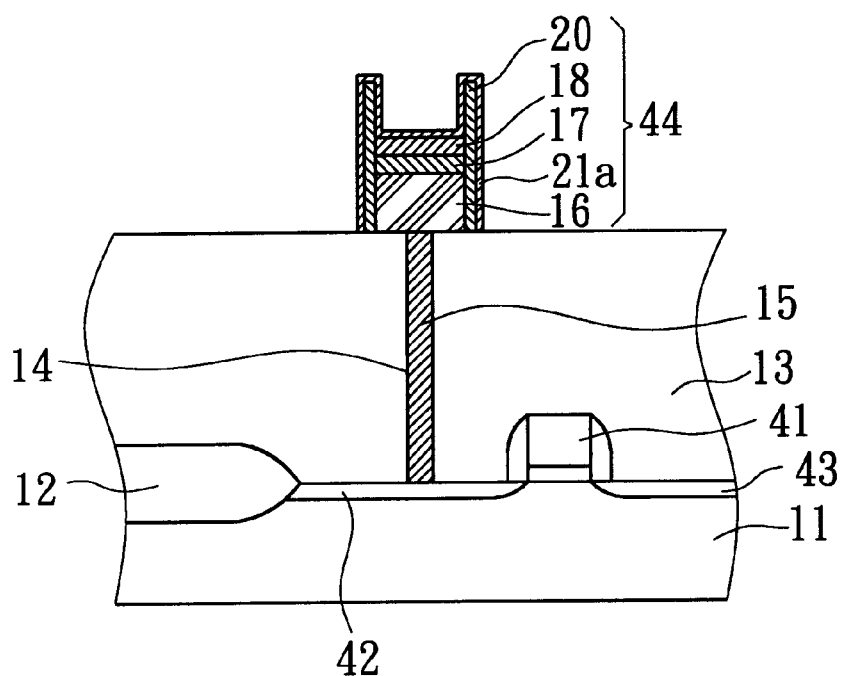

(h) As shown in FIG. 2H, then an etching back process is performed to form a second transition metal spacer 21a to a thickness of about 50 to 500 Å, and a storage node 44 is completing. The storage node 44 is including: the first conductor layer 16, the first barrier metal layer 17, the first transition metal layer 18, the sacrificial layer 19, the barrier metal spacer 20, and the second transition metal spacer 21a.

Figure 2I:
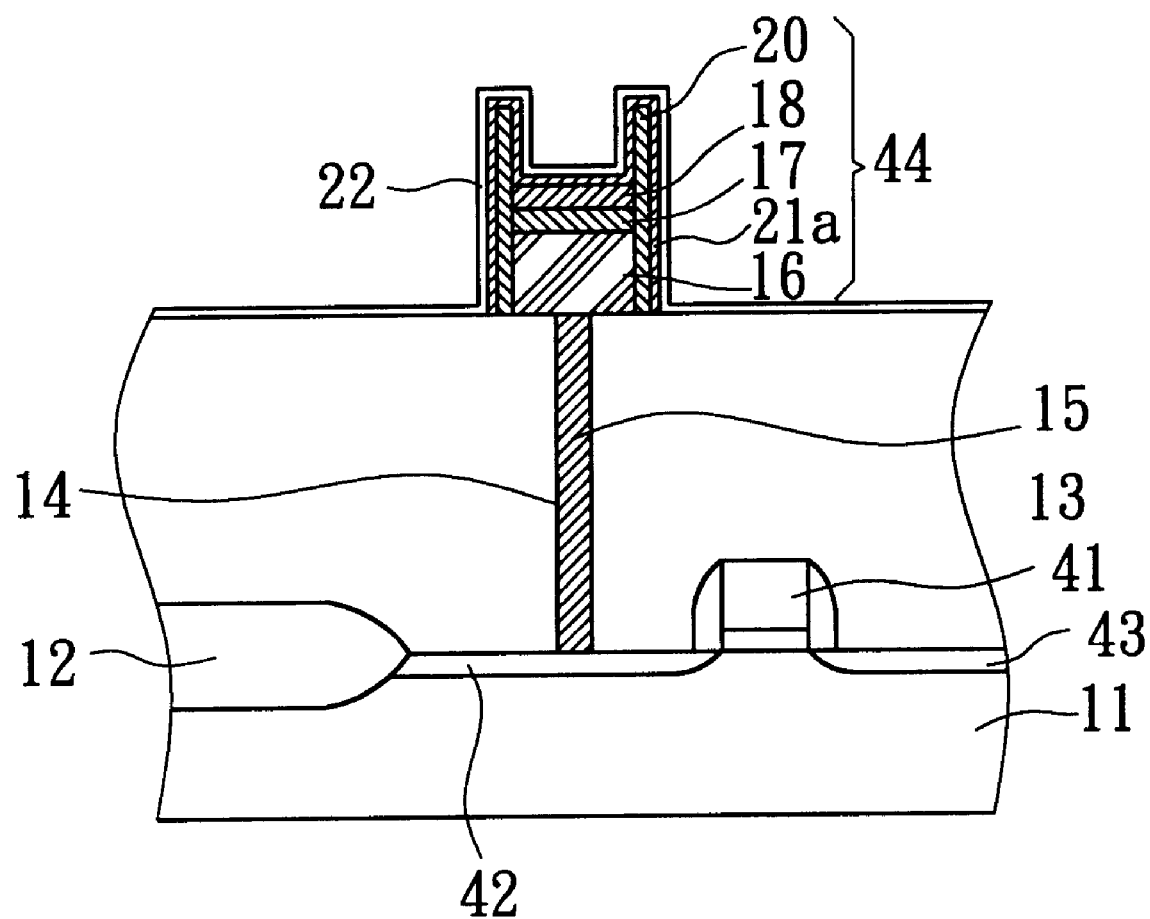

(i) As shown in FIG. 2I, finally, a high dielectric constant layer 22 is formed of a material selected from the group consisting of $SrTiO_3$, $(Ba.St)TiO_3$, and the like.

As described above, the present invention provides a stacked capacitor and method of making in high density DRAM circuit.

The present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method of making stacked capacitor in high density DRAM circuit, comprising the steps of:
   (a) forming a contact plug in an insulating layer on a semiconductor substrate;
   (b) forming a first conductor layer, a first barrier metal layer, a first transition metal layer, and a sacrificial layer in sequence;
   (c) patterning said first conductor layer, said first barrier metal layer, said first transition metal layer, and said sacrificial layer stopping on said insulating layer;
   (d) forming a second barrier metal layer and then etch back to form a barrier metal spacer;
   (e) removing said sacrificial layer to form a recess between said barrier metal spacer;
   (f) forming a second transition metal layer and then etch back to form a transition metal spacer;
   (g) forming a high dielectric constant layer.

2. The method of making stacked capacitor in high density DRAM circuit as recited in claim 1, wherein the step of forming the contact plug comprises the steps of:
   (1) forming a transistor on said semiconductor substrate and then depositing at least a first dielectric layer to be said insulating layer;
   (2) forming a contact hole in said first dielectric layer;
   (3) depositing a conductive layer in the contact hole; and
   (4) planarizing the conductive layer down to an upper surface of said insulating layer.

3. The method of making stacked capacitor in high density DRAM circuit as recited in claim 2, further comprising, after step (1), the steps of:
   depositing a silicon nitride layer as a chemical mechanical polishing (CMP), stopper.

4. The method of making stacked capacitor in high density DRAM circuit as recited in claim 2, wherein said first dielectric layer is made of a material selected from the group consisting of BPSG (BoroPhosphoSilicate Glass) and USG (Undoped Silicate Glass).

5. The method of making stacked capacitor in high density DRAM circuit as recited in claim 2, wherein said first dielectric layer is formed to be 3000 to 12000 Å in thickness.

6. The method of making stacked capacitor in high density DRAM circuit as recited in claim 1, wherein said contact plug is made of a material selected from the group consisting of polysilicon, tungsten, aluminum and amorphous silicon.

7. The method of making stacked capacitor in high density DRAM circuit as recited in claim 1, wherein said first conductor layer is formed of polysilicon.

8. The method of making stacked capacitor in high density DRAM circuit as recited in claim 1, wherein said first conductor layer is formed to be 500 to 3000 Å in thickness.

9. The method of ;making stacked capacitor in high density DRAM circuit as recited in claim 1, wherein said first barrier metal layer is formed to be 50 to 300 Å in thickness.

10. The method of making stacked capacitor in high density DRAM circuit as recited in claim 1, wherein said first transition metal layer is formed to be 100 to 1000 Å in thickness.

11. The method of making stacked capacitor in high density DRAM circuit as recited in claim 1, wherein said barrier metal spacer is formed to be 50 to 1500 Å in thickness.

12. The method of making stacked capacitor in high density DRAM circuit as recited in claim 1, wherein said transition metal spacer is formed to be 50 to 500 Å in thickness.

13. The method of making stacked capacitor in high density DRAM circuit as recited in claim 1, wherein said second transition metal layer is formed as a conformal layer.

14. The method of making stacked capacitor in high density DRAM circuit as recited in claim 1, wherein said first barrier metal layer and said second barrier metal layer are formed of a material selected from the group consisting of TiAlN, TiSiN, TaTiN and TaAlN.

15. The method of making stacked capacitor in high density DRAM circuit as recited in claim 1, wherein said first transition metal layer and said second transition metal layer are formed of a material selected from the group consisting of Pt, Ir and Ru.

16. The method of making stacked capacitor in high density DRAM circuit as recited in claim 1, wherein said sacrificial layer is formed to be 300 to 2000 Å in thickness.

17. The method of making stacked capacitor in high density DRAM circuit as recited in claim 1, wherein said sacrificial layer is formed of a material selected from the group consisting of silicon nitride, $SiO_2$, and SOG(Spin-On Glass).

18. The method of making stacked capacitor in high density DRAM circuit as recited in claim 1, wherein said high dielectric constant layer is formed of a material selected from the group consisting of $SrTiO_3$ and $(Ba.Sr)TiO_3$.

* * * * *